United States Patent [19]

Ohmi

[11] Patent Number: 4,907,053
[45] Date of Patent: Mar. 6, 1990

[54] SEMICONDUCTOR INTEGRATED CIRCUIT

[76] Inventor: Tadahiro Ohmi, No 2-1-17-301, Komegabukuro, Sendai-shi, Miyagi-ken, Japan

[21] Appl. No.: 90,210

[22] Filed: Aug. 27, 1987

Related U.S. Application Data

[63] Continuation-in-part of Ser. No. 637,406, Aug. 3, 1984, abandoned.

[30] Foreign Application Priority Data

Aug. 25, 1983 [JP] Japan ................................. 58-154069

[51] Int. Cl.$^4$ ............................................. H01L 29/78
[52] U.S. Cl. .................. 357/23.1; 357/23.7; 357/42
[58] Field of Search ................. 357/23.7, 23.15, 59 G, 357/23.1, 42, 4, 22

[56] References Cited

U.S. PATENT DOCUMENTS 3,673,471 6/1972 Klein ................................. 357/59 G
4,016,045 8/1978 Nishi ..................................... 357/23
4,385,937 5/1983 Ohmura ............................ 357/23.7
4,489,339 12/1984 Uchida ............................. 357/23.7

FOREIGN PATENT DOCUMENTS 59-210671 11/1984 Japan ............................... 357/23.15

Primary Examiner—Andrew J. James
Assistant Examiner—Mark Prenty
Attorney, Agent, or Firm—Albert L. Jeffers; Anthony Niewyk

[57] ABSTRACT

A semiconductor integrated circuit includes an insulated-gate transistor serving as a driving transistor and composed of source and drain regions of one conductivity type with a high impurity concentration, a channel region disposed between the source and drain regions, an insulating layer covering the substantially entire surface of the channel region except for portions adjacent to the source and drain regions, the insulating layer which covers the channel region having at least a thinner portion, and a gate electrode of a conductive material disposed adjacent to the thinner portion of the insulating layer and having a high diffusion potential with respect to the source region.

36 Claims, 11 Drawing Sheets

SEMICONDUCTOR INTEGRATED CIRCUIT

This is continuation-in-part of application Ser. No. 637,406 filed Aug. 3, 1984, now abandoned.

BACKGROUND OF THE INVENTION

The present invention relates to a semiconductor integrated circuit having as short a channel length as possible, capable of being integrated at a high density, and particularly employing an insulated-gate transistor of high drivability (driving capability) and high operation speed.

Efforts have been made to shorten the channel length and achieve a higher density in insulated-gate field-effect transistor (hereinafter referred to as a "MOS-FET") for higher performance.

MOSFETs having shorter channel lengths are normally designed on the basis of the scaling theory. As described in detail in Japanese Patent Application No. 57-113709 filed on June 29, 1982, entitled "Semiconductor Integrated Circuit", shortening the channel length based on the scaling theory has suffered drawbacks in that since the concentration of impurities in the channel is increased as the channel length is shortened, the mobility of carriers travelling through the channel is lowered, and carriers induced directly below a gate insulating film are distributed to a depth of at most about 100 Å or smaller. Therefore, the effective carrier mobility is further lowered resulting in a smaller transconductance. The input capacitance of the gate is increased, and characteristics are not so improved as expected of the shortened channel length. The drain breakdown voltage is inevitably reduced with increasing the channel impurity concentration. Another shortcoming is that since a voltage applied to the drain is concentrated on the end of the channel close to the drain, its electric field intensity is increased to produce a greater hot-electron effect, resulting in a wide variation in a threshold voltage.

To overcome the foregoing drawbacks, there have been proposed insulated-gate static induction transistors (hereinafter referred to as "MOSSIT") in which the concentration of impurities in the channel in which carriers travel is sufficiently low, induced carriers distributed not only just under the gate insulating film but sufficiently deep into the interior, thus the carrier mobility and the transconductance are large, the gate input capacitance is small, the operation speed is higher as the channel length is shorter, the power consumption is small, and the drain breakdown voltage is large. Such MOSSITs are disclosed in Japanese Patent Application No. 54-108377 entitled "Insulated-Gate Transistor and Integrated Circuit", Japanese Patent Application No. 54-115491 entitled "Semiconductor Memory", Japanese Patent Application No. 57-113709 entitled "Semiconductor Integrated Circuit", and Japanese Pat. Application No. 57-161980 entitled "Semiconductor Integrated Circuit". One example of the MOSSIT is shown in FIG. 1 of the accompanying drawings. Designated in FIG. 1 at 11 is an electrode, 12 a p+ substrate, 13 a high-resistivity p⁻ region, 14, 15 n+ region, 16, 17 layers of $MoSi_2$, $WSi_2$, $TaSi_2$, $TiSi_2$, $Pd_2Si$, 18, 19 electrodes of Al, $AlSi_2$, AlCu, 20 a gate insulating film or gate oxide film, 21 a gate electrode, 22 isolation regions, 23 a PSG film, and 24 a passivation PSG or nitride ($Si_3N_4$) film.

The region 13 is a high-resistivity region with a low impurity concentration of $1 \times 10^{15}$ cm$^{-3}$ or below, preferably $1 \times 10^{14}$ cm$^{-3}$ or below. Normally-off characteristics of this MOS transistor is not achieved by increasing the impurity concentration in the channel as with conventional MOSFETs, but by a diffusion potential of the p+ region of the substrate with respect to the n+ source region and a diffusion potential of the gate electrode material with respect to the n+ source region. Stated otherwise, a potential barrier is created in the channel by the diffusion potentials of the p+ substrate and the gate electrode.

It is preferable that the gate electrode material have a high diffusion potential relative to the n+ source region. For example, a portion of the gate electrode which is adjacent to the gate insulating film will have a high diffusion potential if made of p+ polysilicon. Where the resistance of the gate electrode is too high with only p+ polysilicon used, a layer of silicide or a metal electrode should be placed on the gate electrode. For example, when boron-doped silicon-rich molybdenum silicide is deposited as by RF bias sputtering technics and followed by thermal treatment, p+ polysilicon is precipitated in a portion adjacent to the gate insulating film with $MoSi_2$ formed thereon. The gate electrode may be of Al, $AlSi_2$, or AlCu. The gate electrode of Al has a diffusion potential of about 0.7 V relative to the n+ region. Other metals such for example as Mo, W or metal silicides such for example as $MoSi_2$, $WSi_2$, $TaSi_2$, $TiSi_2$, $Pd_2Si$ may also be used.

The region 13 shown in FIG. 1 is a p⁻ region. If the impurity concentration is about $10^{14}$ cm$^{-3}$ or below, then the potential distribution in the channel remains substantially unchanged even with the n⁻ region. Let the depth of the p⁻ region be expressed by D and the effective channel length by $L_{eff}$, the normally-off characteristics is sufficiently held up to a range indicated by:

$$L_{eff}/D \equiv 1$$

in the construction of FIG. 1 under the condition that no bias voltage is applied to the substrate.

FIG. 2 shows a distribution of electron concentration induced in a semiconductor below a gate oxide film when a voltage of 3 V is applied to a MOS diode in which the gate oxide film has a thickness of 200 Å. Naturally, electrons are distributed more deeply in the substrate as the impurity concentration in the substrate is lower. The potential distribution at this time is illustrated in FIG. 3.

Now, a voltage of a waveform having a unit step function as shown in FIG. 4(a) is applied to the gate of the MOS transistor constructed as shown in FIG. 1. It is assumed that a power supply for generating such a voltage has a sufficiently small internal resistance and can supply a sufficient current, and the resistivity of the p+ substrate 12 is sufficiently small. At the moment the unit step voltage is applied, a potential distribution from the gate electrode to the p+ substrate is as shown in FIG. 4(b) in which a negative voltage is shown as being higher since the potential with respect to electrons is illustrated. Designated in FIG. 4(b) at $V_g$ is a voltage applied to the gate, $V_{bi1}$ a diffusion potential of the gate electrode 21 to the n+ source region 14, and $V_{bi2}$ a diffusion potential of the p+ substrate 12 to the n+ source region 14. Indicated by the horizontal dotted line in FIG. 4(b) is a Fermi level of the n+ source region. A voltage $V_{ox}$ across the gate oxide film and a voltage $V_s$ applied to the semiconductor are given respectively by:

$$V_{ox} = \frac{\frac{\epsilon_s}{\epsilon_{ox}} T_{ox}}{D + \frac{\epsilon_s}{\epsilon_{ox}} T_{ox}} V_g \qquad (1)$$

$$V_s = \frac{D}{D + \frac{\epsilon_s}{\epsilon_{ox}} T_{ox}} V_g \qquad (2)$$

A surface potential $\phi_s$ directly below the gate insulating film is given by:

$$\phi_s = V_{bi1} + V_{ox} \approx V_g \qquad (3)$$

where $\epsilon_{ox}$ and $\epsilon_s$ are the dielectric constants of the gate insulating film and the semiconductor, and $T_{ox}$ is the thickness of the gate insulating film. If $\phi_s < 0$, then a potential region with its potential lower than that of the source extends from the surface to x as shown in FIG. 4(b), and a large amount of electrons are momentarily injected from the source into the channel so that a large current flows. When electrons are injected from the source into the channel, the potential distribution is changed to one similar to that shown in FIG. 3.

At any rate, with a bulk MOS or epitaxial MOS in which the channel region as shown on FIG. 1 is contiguous to the substrate, the substrate is kept at a constant voltage (which is the same as that of the source in FIG. 4(b)), and the entire channel regions prevented from being at a potential lower than the source potential. Therefore, no large instantaneous current flows, and there is little effect of highly increasing the driving capability at the time of high-speed operation.

SUMMARY OF THE INVENTION

It is an object of the present invention to provide a semiconductor integrated circuit having an insulated-gate transistor which allows a large instantaneous current to flow in high-speed operation, has quite a high driving capability, and is capable of high-speed operation.

According to a first aspect of the present invention, there is provided a semiconductor integrated circuit comprising an insulated-gate transistor serving as a driving transistor and composed of source and drain regions of one conductivity type and a high impurity concentration, a channel region disposed between the source and drain regions, an insulating layer covering almost the entire surface of the channel region except for portions adjacent to the source and drain regions, the insulating layer which covers the channel having at least a thinner portion, and a gate electrode of a conductive material disposed adjacent to the thinner portion of the insulating layer.

According to a second aspect of the present invention, there is provided a semiconductor integrated circuit comprising two complementary insulated-gate transistors of different conductivity types having drain and gate electrodes directly connected to each other, the connected gate electrodes serving as an input terminal and the connected drain electrodes as an output terminal, each of the insulated-gate transistors being composed of source and drain regions of one conductivity type and a high impurity concentration, a channel region disposed between the source and drain regions, an insulating layer covering the almost entire surface of the channel region except for portions adjacent to the source and drain regions, the insulating layer which covers the channel having at least a thinner portion, and a gate electrode of a conductive material disposed adjacent to the thinner portion of the insulating layer.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 4A:
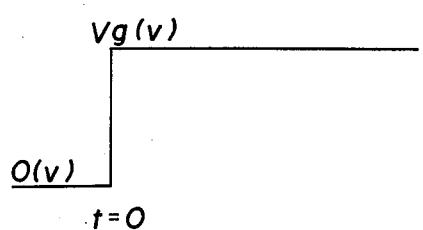
FIGS. 4(a) and 4(b) are diagrams illustrating the operation of a high resistivity channel MOS transistor.
Figure 4B:
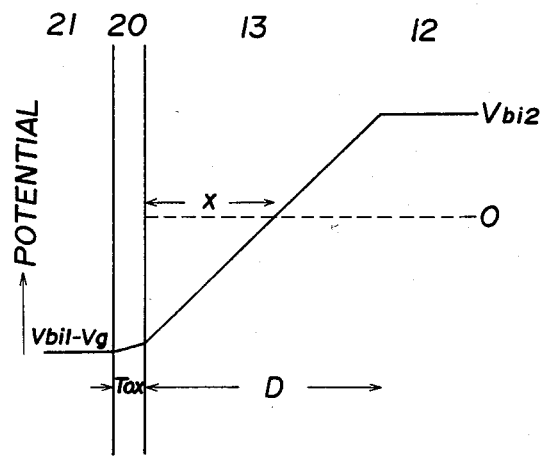

Features of a SOI (Silicon On Insulator) MOS transistor against bulk MOS and epitaxial MOS transistors will first be described. The SOIMOS transistor normally means a MOS transistor fabricated in a thin layer of silicon deposited on an insulating film such as an oxide film ($SiO_2$ film), a nitride film ($Si_3N_4$ film) or a combination of these films ($Si_3N_4$ on $SiO_2$) formed on the surface of a silicon substrate. The thin silicon layer is first deposited by technics such for example as CVD (chemical vapor deposition, plasma CVD, photo CVD), RF bias sputter, MBE (molecular beam epitaxy), as a polycrystalline or amorphous layer on the insulating film. Then, the crystalline grain is enlarged by a laser annealing, an electron beam annealing or a heater annealing, or is converted into a single crystal by such technics for example as bridging epitaxy from the silicon substrate. The insulating layer on the silicon surface is not limited to the $SiO_2$ on $Si_3N_4$ film. It may be of magnesia spinel ($MgO$–$Al_2O_3$) of a cubic system (a=8.08 Å, a lattice mismatching with Si is 0.8%) (see Ihara, Arimoto, and Yamada, "Silicon on Epitaxial Spinel", Preliminary Papers for the 30th Applied Physics combined lecture conference, 6p-E-3, page 668, 1983) or $CaF_2$ having a good lattice constant matching with silicon (see T. Asano and H. Ishihara, "Formation of an Epitaxial Si/Insulator/Si structure by vacuum deposition of $CaF_2$ and Si", Proc. 1981 Conf. Solid State Devices: Jap. J. Appl. phys. Supplement, Vol. 21-1, pages 187–191, 1982). In such a case, Si is formed by epitaxial growth on the insulating film without annealing. The SOIMOS transistor is characterized by a structure in which the channel region is covered with insulators on its upper and lower surfaces. Therefore, it has advantages in that transistors can be separated from each other more completely and the capacitance of wiring is reduced for higher-speed operation compared to conventional bulk on epitaxial MOS transistors. However, the SOIMOS transistor is essentially different from the bulk MOS transistor or epitaxial MOS transistor in that the back surface of the channel region is not kept at a constant voltage as shown in FIG.4(b). More specifically, the channel region is basically under floating condition though the potential profile in the channel region is controlled potentially by contact with the source region and the drain region. The conventional SOIMOSFET includes a contact to keep the voltage of the channel region at a same level to the source region for stable operation.

The MOS transistor according to the present invention comprises a SOIMOS transistor (Floating channel SOIMOS transistor) with a channel region kept in substantially floating condition, in which a large instantaneous current can flow at a time of turn-off process through positively utilizing the property of the floating channel inherent in a SOIMOS transistor.

Figure 1:
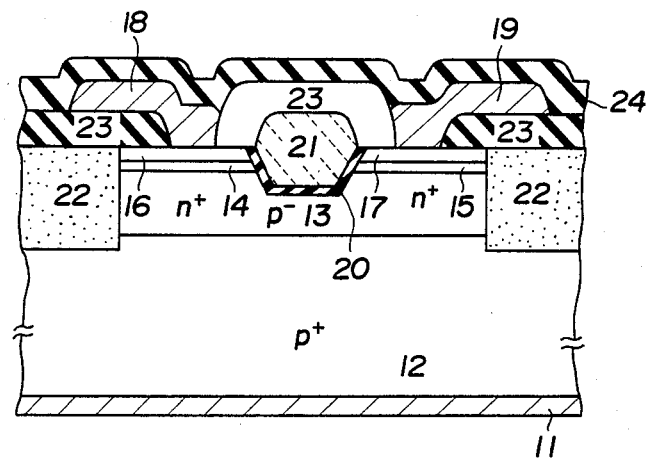
FIG. 1 is a cross-sectional view of a conventional MOSFET.
Figure 3:
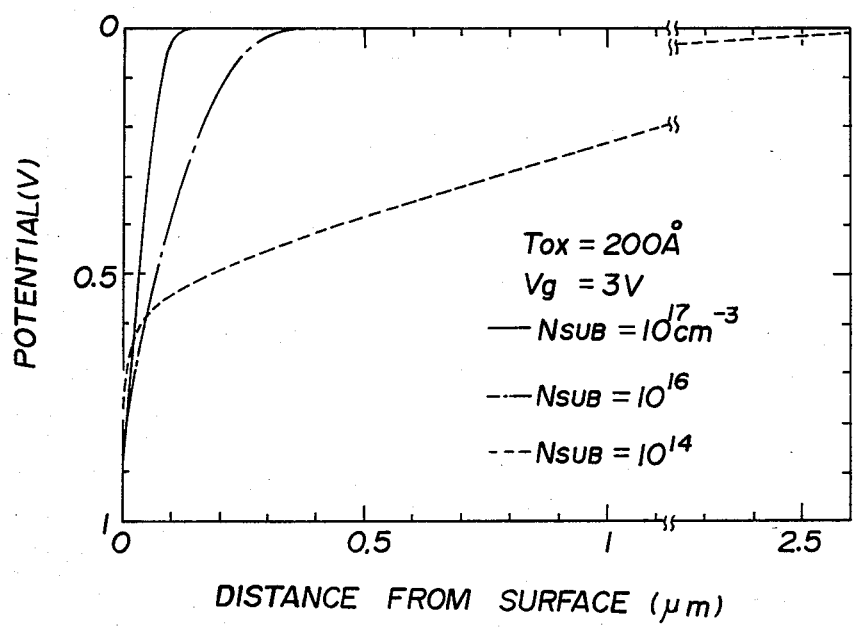
FIG. 3 is a graph showing a potential distribution below a gate insulating film at the same condition of FIG. 2.
Figure 5:
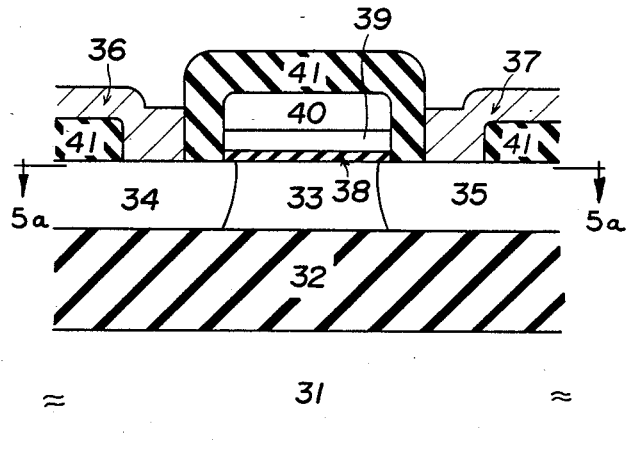
FIG. 5 is a cross-sectional view of a floating channel MOS transistor according to an embodiment of the present invention.

FIG. 5 shows a SOIMOS transistor according to the present invention. Designated at 31 is a substrate of Si, 32 an insulating layer of $SiO_2$, or thin insulating film provided with $SI_3N_4$ film on the $SiO_2$, for example, 33 a channel region, 34 an n+ source region, 35 an n+ drain region, 36 a source electrode, 37 a drain electrode, 38 a gate insulating film of $SiO_2$, $Si_3N_4$, for example, 39 a p+ polysilicon, 40 a layer of silicide such as $MoSi_2$, $WSi_2$, $TaSi_2$, $Ti_2Si$, $Pd_2Si$, or metal of a high melting point such as Mo, W, Pt, Ta, Ti, and 41 a PSG film. Although in the embodiment of FIG. 5 the n+ source and drain region extend fully across the thickness of the silicon layer on the insulating film 32, such an arrangement is not a requirement of the present invention. As shown in FIG. 1, high impurity concentration layers thinner than the thin silicon layer may be provided so as to serve as source and drain regions. The substrate 31 may be of the p+, p or in some cases n type. Although not shown, an electrode is attached to the substrate with a prescribed voltage applied to the electrode. In the illustrated embodiment, the gate electrode positioned directly adjacent to the gate insulating layer is fabricated of p+ polysilicon having a highest diffusion potential with respect to the n+ source region, and to reduce the gate resistance, the layer of silicide 40 such for example as $MoSi_2$, $WSi_2$, $TaSi_2$, $TiSi_2$, $Pd_2Si$ or metal such for example as Al, AlSi, AlCu, Mo, W is placed on the gate electrode. The entire gate electrode may be formed of such for example as Al, AlCu, W, Mo, Pt, Ta, Ti, $MoSi_2$, $WSi_2$, $TiSi_2$, or $TaSi_2$, without providing p+ polysilicon layer, though these materials have slightly lower diffusion potential compared to the p+ region. For the surface potential of the channel region just under the gate insulting layer which is quite thin is substantially equal to the diffusion potential in the case where the gate is directly coupled to the source (which is not the case with an appreciable amount of fixed charges and surface state density in the gate insulating film). The gate insulating layer 38 is formed of $Si_2O$, $Si_3N_4$, $SiO_xN_y$, or the like, but may comprise a multiple-layer film of these materials. For appreciably reducing a gate-to-source capacitance $C_{gs}$ and a gate-to-drain capacitance $C_{gd}$, and particularly for increasing a gate-to-drain breakdown voltage, it is preferable that the gate insulating layer should comprise a double-layer film composed of a film of $SiO_2$ and a film of $Ta_2O_5$. $SiO_2$ has a specific dielectric constant of about 3.8 while $Ta_2O_5$ has a specific dielectric constant of about 22. Thus, the dielectric constant of $Ta_2O_5$ is about six times larger than that of $SiO_2$. If the capacitance of the gate insulating film remains the same, then the effect of the gate voltage to control the potential distribution in the channel region also remains the same. If the same value of a capacitance given by an insulator having a dielectric constant $\epsilon_{ox1}$ and a thickness $T_{ox}$ is to be achieved by a double-layer film composed of an insulator having a dielectric constant $\epsilon_{ox1}$ and a thickness $T_{ox1}$ ($T_{ox1} < T_{ox}$) and an insulator having a dielectric constant $\epsilon_{ox2}$ ($\epsilon_{ox2} > \epsilon_{ox1}$) and a thickness $T_{ox2}$, then the following relationship results:

$$T_{ox} = T_{ox1} + \frac{\epsilon_{ox1}}{\epsilon_{ox2}} T_{ox2} \tag{4}$$

For example, a film of $SiO_2$ having a thickness of 100 Å and a double-layer film composed of a film of $SiO_2$ having a thickness of 50 Å and a film of $Ta_2O_5$ having a thickness of 290 Å have the same effect of controlling the channel region potential. Since the total film thickness of the double-layer film is 340 Å, it is highly effective to increase the gate-to-source and gate-to-drain breakdown voltage or reduce gate-to-source and gate-to-drain short circuits. The large thickness of gate insulating film is highly advantageous in the fabrication process. The double-layer film of $SiO_2$ and $Ta_2O_5$ is fabricated by depositing a prescribed thickness of Ta$_2$O$_5$ on the clean surface of silicon by sputtering or CVD, and thereafter effecting wet oxidization or (H$_2$+O$_2$) oxidization at a temperature ranging from 750° to 850° C. In such a fabrication process, oxygen reaches the surface of silicon through the film of Ta$_2$O$_5$ to achieve high uniformity SiO$_2$ film between Si and Ta$_2$O$_5$. Rather than exposing the silicon surface directly to an oxidizing atmosphere, the deposited film of Ta$_2$O$_5$ should be pinhole-free, homogeneous, and uniform to produce an oxide film of high quality under high controllability. The film of SiO$_2$ thus fabricated and having a thickness in the range of from 50 to 100 Å has a breakdown electric field intensity which exceeds 15 MV/cm.

In FIG. 5, the channel 33 is held in substantially floating condition. Operation in the case where the channel 33 is of a p region will first be described.

Figure 6:
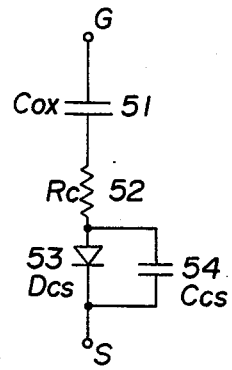
FIG. 6 is a circuit diagram explanatory of operation of the floating channel MOS transistor of one embodiment of the present invention.

When a gate voltage having a very short rise time is applied to the gate, the gate to source circuit property is illustrated as a circuit in diagram in FIG. 6 where parasitic circuit elements have been removed. The circuit includes a capacitor 51 ($C_{ox}=L_{eff}W\epsilon_{ox}/T_{ox}$: W is the gate width) formed by the gate insulating film, a resistance 52 of the p-type channel region, pn$^+$ diode D$_{cs}$ 53 between the channel and the source, and a capacitor C$_{cs}$ 54 contained in the diode D$_{cs}$. The capacitor C$_{cs}$ includes a junction capacitance and a diffusion capacitance which appears in the pn junction with a forward bias voltage. The diffusion capacitance decreases drastically as an effective channel length becomes shorter than a diffusion length of electrons in the p channel region. Now, let it be assumed that a voltage having a unit step waveform as illustrated in FIG. 4(a) is applied by a power supply having a sufficiently low internal resistance to the gate of the transistor shown in FIG. 5. At an instant the gate voltage V$_g$ is applied, the potential V$_c$ of the p channel region, because of the floating channel, is expressed as follows:

$$V_c = \frac{C_{ox}}{C_{ox} + C_{cs}} V_g \quad (5)$$

If C$_{ox}$ is sufficiently larger than C$_{cs}$, then the gate voltage is almost entirely applied instantaneously to the channel region. C$_{ox}$, C$_{cs}$ are approximately given by:

$$C_{ox} = \frac{\epsilon_{ox} L_{eff} W}{T_{ox}} \quad (6)$$

$$C_{cs} = \frac{\epsilon_s D W}{W_d}$$

where C$_{cs}$ is the junction capacitance, L$_{eff}$ is the effective channel length, W is the gate width, D is the thickness of the p channel region, and W$_d$ is the width of the depletion layer between the n$^+$ source and the p channel region. If the n$^+$source region is of a sufficiently high impurity concentration, the width W$_d$ is given by:

$$W_d = \left( \frac{2\epsilon_s V_{bi}}{qN_A} \right)^{1/2} \quad (7)$$

$$V_{bi} = \frac{KT}{q} \ln \frac{N_D N_A}{n_i^2} \quad (8)$$

where q is the unit charge, K is the Boltzmann's constant, T is the temperature, N$_i$ is the intrinsic carrier concentration, N$_D$ is the impurity concentration in the n$^+$ source region, and N$_A$ is the impurity concentration in the p channel region.

$$\frac{C_{cs}}{C_{ox}} = 2.86 \frac{D}{L_{eff}} \frac{T_{ox}}{W_d}$$

If N$_D$=5×10$^{20}$ cm$^{-3}$

V$_{bi}$, W$_d$, C$_{cs}$/C$_{ox}$ have the following values for different values of N$_A$ for silicon at room temperature:

TABLE 1

| N$_A$ | V$_{bi}$ | W$_d$ | C$_{cs}$/C$_{ox}$ |
|---|---|---|---|
| 5 × 10$^{16}$ cm$^{-3}$ | 1.02 V | 1640Å | 1.187 |
| 1 × 10$^{17}$ cm$^{-3}$ | 1.04 V | 1170Å | 0.122 |
| 5 × 10$^{17}$ cm$^{-3}$ | 1.08 V | 530Å | 1.270 |
| 1 × 10$^{18}$ cm$^{-3}$ | 1.10 V | 380Å | 0.376 |

C$_{cs}$/C$_{ox}$ in Table 1 is determined when L$_{eff}$=2D and T$_{ox}$=100 Å. Naturally, the greater the N$_A$ the greater the C$_{cs}$/C$_{ox}$. With a MOS transistor in which N$_A$ is 1×10$^{18}$ cm$^{-3}$, C$_{ox}$ is considerably larger than C$_{cs}$ (junction capacitance) for a channel region having a highest possible concentration if the thickness of the oxide film is about 100 Å or less. Therefore, the moment the gate voltage is applied, the entire p channel region under floating condition tends to be highly forward-biased with respect to the n$^+$ source region. Electrons are injected from the n$^+$ source region into the entire p channel region, which is adjacent to the n$^+$ source region. This process is the same as the manner in which carriers are injected from an emitter into a base of bipolar transistor, and is entirely different from the condition in which electrons are injected into only a narrow channel directly below a gate insulating film in a conventional MOSFET. Stated otherwise, electrons are injected into the entire p channel region and a much higher current flows than would be the case with the conventional MOSFET.

Figure 7:
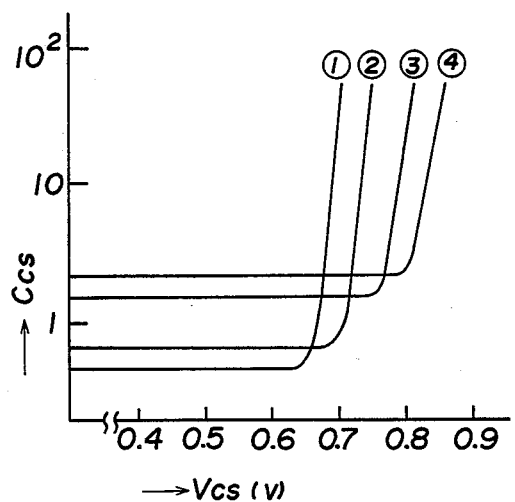
FIG. 7 is a graph illustrative of the dependency of a channel-to-source capacitance on a forward bias voltage between a channel and a source.

As electrons are sufficiently injected into the p channel region, that is, the junction between the channel and the source is sufficiently highly forward-biased, the diffusion capacitance is piled up to C$_{cs}$ in addition to the conjunction capacitance. The diffusion capacitance increases with the forward biasing voltage. One example of such a condition is illustrated in FIG. 7, which has a vertical axis indicative of normalized C$_{cs}$ in logarithmic scale and a horizontal axis of a forward biasing voltage V$_{cs}$ applied between the channel and the source. The curves 1, 2, 3 and 4 are representative of variations in C$_{cs}$ for N$_A$=5×10$^{16}$ cm$^{-3}$, 1×10$^{17}$ cm$^{-3}$, 5×10$^{17}$ cm$^{-3}$, and 1×10$^{18}$ cm$^{-3}$, respectively. If N$_A$ is small, the junction capacitance is small, but many electrons are injected at a low forward biasing voltage and the diffusion capacitance increases at a high rate from a low voltage. If N$_A$ is large, the junction capacitance at a low voltage is large, but the forward voltage at which the diffusion capacitance starts to be effective is high. At any rate, the potential of the p channel region is stabilized when the diffusion capacitance is increased to the extent that C$_{cs}$ is greater than C$_{ox}$. FIG. 7 shows the result of the case in which the channel length is longer than the diffusion distance (L$_D$). In the case of the short channel where L$_D$>L$_{eff}$, the diffusion capacitance hardly appears. The rapid increase of the diffusion capacitance is suppressed by making the effective channel length shorter than the diffusion length of electrons in the channel region, even if the channel region is biased deeply in a forward direction. The electrons injected from the source region flow due to a diffusion and a drift through the p channel region toward the drain region, as in the base region in a bipolar transistor, provided an impurity concentration gradient extends from the source toward the drain. This operation is the same as that of a bipolar transistor in which the potential of the base region is controlled through a base resistance to control the current. Immediately after the gate voltage is applied, a very high current flows to provide a large driving capability.

Figure 8:
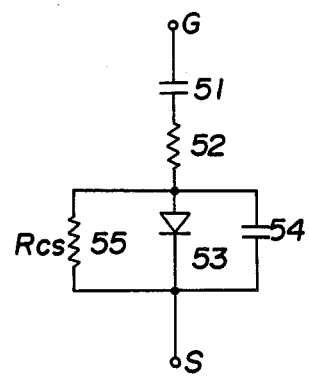
FIG. 8 is a circuit diagram explanatory of operation of the transistor of the present invention.
Figure 9:
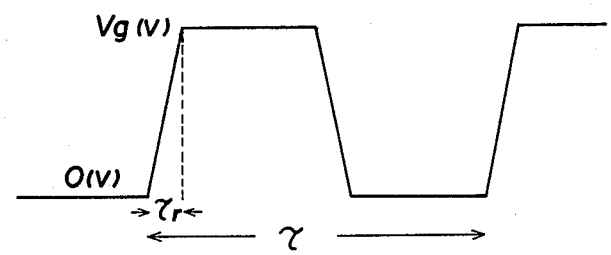
FIG. 9 is a diagram of the waveform of a voltage applied to a gate.

This operation however has two drawbacks. One drawback is that, since the junction between the channel and the source is forward-biased, a few holes are injected from the p channel region into the n+ source region at the same time that the electrons are injected from the n+ source region into the p channel region. Therefore, each time the transistor is turned on, positive holes flow out of the p channel region to charge up the floating p channel region negatively. This tendency is promoted by a process in which the electrons injected into the p channel are recombined with holes in the p channel region. Charging the p channel region negatively means that the drain current becomes small, even if applying the same positive gate voltage, resulting in unstable operation. Holes in the p channel region are not replenished since there is only the n+ region around the floating p channel region. As shown in FIG. 8 to overcome the above shortcoming, it is necessary to connect a resistor 55 $R_{cs}$ having a suitable resistance between the p channel region and the source region. When the p channel region is negatively biased due to a lack of holes flowing therefrom, the negative charge is discharged through the resistor $R_{cs}$. The resistance of this resistor $R_{cs}$ is selected such that it is substantially ineffective when a sharply rising voltage is applied to the gate. More specifically, if a pulse voltage applied to the gate has a period $\tau$ and a rise time $\tau_{68}$ as shown in FIG. 9, the following condition should be met:

$$R_{cs} \cdot C_{cs} > \tau_\epsilon \quad (9)$$

In order for the negative charge in the channel to be substantially discharged until a next pulse voltage is applied, the following condition should be met:

$$R_{cs} \cdot C_{cs} \} \tau \quad (10)$$

To meet the conditions (9), (10), the resistor $R_{cs}$ can be realized by inserting a polysilicon resistor between the channel and the source. That may also be realized by providing high concentration p+ region of such a structure as contacting both n+ source region 34 and p channel region 33 on the mere part of the conjunction surface of n+ source region and p channel region. When the impurity concentration of the high-concentration P+ region is made about $1 \times 10^{19}$ cm$^{-3}$, preferably above $5 \times 10^{19}$ cm$^{-3}$, the charge of p region 33 is discharged as tunnel current between n+ region 34 and high-concentration p+ region. This can prevent the unstable charge-up process which would otherwise be caused by holes flowing out of the channel. The channel region thus placed under the above condition is expressed as being in a substantially floating condition.

Figure 5A:
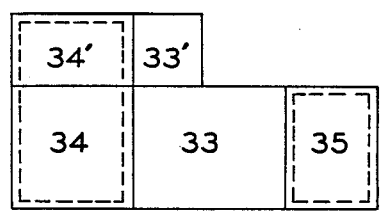
FIG. 5(a) is a top view of FIG. 5 taken along line 5—5 thereof showing an example of the structure of the insulating-gate transistor of this invention.
Figure 5B:
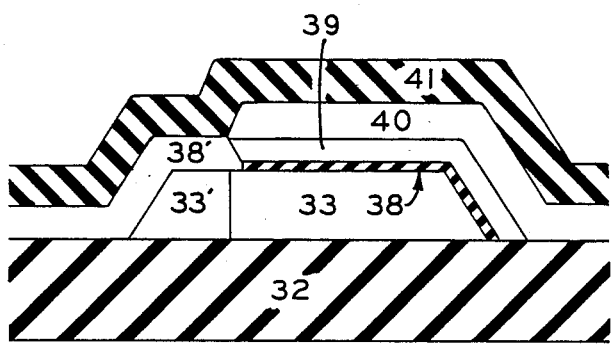
FIG. 5(b) is a cross-sectional view of the transistor of FIG. 5(a) along lines A-A' thereof.

FIG. 5(a) is a top view of FIG. 5 taken along line 5—5 which shows an example of the structure of the insulating-gate transistor of the invention. FIG. 5(a) shows the structure in which $R_{cs}$ shown in FIG. 8 is formed. FIG. 5(b) shows a cross-section of the transistor FIG. 5(a) along line A-A'.

In FIG. 5(a), 33' is a same conductivity type region as the channel region 33 (in this case p region). 34' is a same conductivity type high impurity region as the channel region 33 (in this case p+ region). The n+ source region 34 and p+ region 34' are connected by a metal electrode. The dotted line in FIG. 5(a) shows the contact hole for the metal electrode. The p region 33' of fixed impurity concentration which forms $R_{cs}$ exists adjacent to the left side of the p channel region 33.

We can make $R_{cs}$ by forming the p region 33 and the p+region 34' which is connected to the n+ region by the metal electrode. As shown in FIG. 5(b), there exists the case that part of the p region is adjacent to the semi-conductor region (not the insulating layer).

It is preferable to design the impurity concentration of the p region 33' higher than that of the p region 33. When the impurity concentration of p region 33' is higher than that of p region 33, the electrons ejected into channel 33 from the n+ source region can arrive at the n+ region efficiently without flowing to p region 33.

Another shortcoming will be described. The MOS transistor of the present invention described thus far achieves its normally-off characteristics in which no current flow is guaranteed at zero gate voltage by the presence of the neutral region between the source and drain regions, as with the conventional scaling law. Therefore, as the effective channel length is shorter, the impurity concentration in the channel region should be higher. A current which can flow at a steady state condition is accordingly a current flowing through a narrow channel directly below the gate insulating film. The transistor has a drawback in that the instantaneous channel voltage $V_c$ defined by the equation (5) becomes smaller as $C_{cs}$ is relatively greater due to a higher impurity concentration in the channel. The gate input capacitance becomes progressively greater as the impurity concentration in the channel is higher. When the transistor is driven by the pulse voltage having the rise time $\tau_\epsilon$ as shown in FIG. 9, a current $i_c$ flowing into the capacitor is approximately given by $$i_c \approx \frac{C_{ox} C_{cs} V_g}{(C_{ox} + C_{cs}) \tau_\gamma} \quad (11)$$

$$= \frac{C_{cs} V_g}{(1 = C_{cs} / C_{ox}) \tau_\gamma}$$

Therefore, the current $i_c$ is increased as $C_{cs}$ is increased. Thus, a large current is required to drive the MOS transistor. Better transistors suitable to high speed VLSI are transistors that can be driven by a smaller current at a higher speed.

To overcome the above two problems at the same time, the channel region 33 in the SOIMOS transistor of the present invention as shown in FIG. 5 should be constructed as a high resistivity region which is substantially free from impurities. The impurity concentration N (cm$^{-3}$) in the channel region should be selected such that an average distance $N^{-\frac{1}{3}}$ of impurities is sufficiently longer as compared with the depth D of the channel region.

$$N < D^{-3} \quad (12)$$

For instance, where D is 1 μm, 0.3 μm, and 0.1 μm, N should be smaller than $1 \times 10^{12}$ cm$^{-3}$, $3.7 \times 10^{13}$ cm$^{-3}$, and $1 \times 10^{15}$ cm$^{-3}$, respectively. By such selection, there are substantially no impurities present in the channel region.

The normally-off characteristics can be achieved by increasing the diffusion potential of a gate material with respect to a source region. Where a current flowing along an interface between the channel region 33 and the insulating layer 32 (i.e. a backsurface of the channel region) is problematic, the substrate 31 should be placed under a given negative potential to increase the potential of the interface with respect to the source. Since the channel region 33 is formed as the high resistivity region, the gate input capacitance is quite small and there is no problem of the negative charge-up to a lack of holes flowing from the channel region. Stated otherwise, since the transistor can be driven with a small current at a sufficiently high speed and the gate voltage is also applied highly effectively on the channel at a moment, the potential of the channel is lowered to induce enough injection of electrons from the source region to allow a large current to flow. As a consequence, the MOS transistor of the present invention has quite a high driving capability and operates at a high speed.

For making use of the high resistivity channel region, a leakage current through the interface between the channel region and the insulating layer 32 should be reduced, and hence, the interface should of course be fabricated of silicon of good crystal quality. For some interface potential control from the side of the substrate, the insulating layer 32 should not be unduly thick, and should be in the range of from 0.2 to 0.6 μm.

Figure 10:
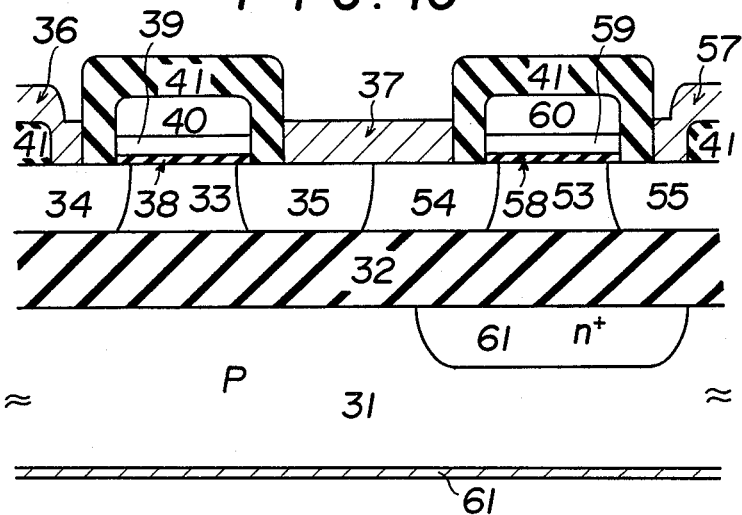
FIGS. 10, 11, 12 and 13 are cross-sectional views of semiconductor integrated circuits according to other embodiments of the present invention.

FIG. 10 illustrates a CMOS construction comprising SOIMOS transistors of the present invention which have high resistivity channel regions. A subsrate 31 is of the p type and has an electrode 61. Identical reference characters in FIG. 10 denote identical regions of the n-channel SOIMOS transistor of FIG. 5. Denoted at 53 is a high resistivity channel region, 54 a p+ drain region, 55 a p+ source region, 57 a source electrode of Al, AlSi, AlCu, for example, 58 a gate insulating film, 59 an n+ polysilicon region, 60 a layer of silicide such for example as MoSi$_2$, WSi$_2$, TaSi$_2$, TiSi$_2$, Pd$_2$Si, or of metal of a high melting point such for example as Mo, W. Ta, or Ti, and 61 an n+ buried layer formed in a substrate 31 below a p channel transistor with an insulating layer 32 interposed therebetween. The n+ region 61 has an electrode (not shown) attached to a surface at a given position so that a predetermined potential can be applied through the electrode to the n+ region 61. An electrode 37 is disposed directly over and across the n+ drain region 35 and the p+ drain region which are adjacent to each other. In view of the fabrication process, there may be instances wherein there is a field oxide film for separation in an area where the regions 35, 54 are located adjacent to each other.

In the embodiment of FIG. 10, the gate electrode held in direct contact with the gate insulating film in the n channel is formed of p+ polysilicon and the gate electrode held in direct contact with the gate insulating film in the p channel is formed of n+ polysilicon to increase a diffusion potention with respect to the source regions. Such materials are preferable for sufficiently achieving normally-off characteristics. However, as described later on if $L_{eff}$ is long with respect to the channel depth D, for example, $L_{eff}/D > 2$, then normally-off characteristics can sufficiently be achieved by a single-layer structure of silicide such as MoSi$_2$, WSi$_2$, TaSi$_2$, TiSi$_2$, Pd$_2$Si or of metal such as Mo, W, Ta, Ti, Al rather than employing the above double-layer structure. This alternative is much simpler from the standpoint of the fabrication process. The gate metal can be made of Al, Al-Si or Al-Cu, if low temperature process is realized such as a process temperature less than 450° C.

The CMOS arrangement of the present invention as shown in FIG. 10 is advantageous in that the gate input capacitance is quite small and a very large current can be allowed to flow momentarily at a switching time, so that the arrangement is of a large driving capability, operates at a high speed, and is of a small power consumption requirement.

Figure 11:
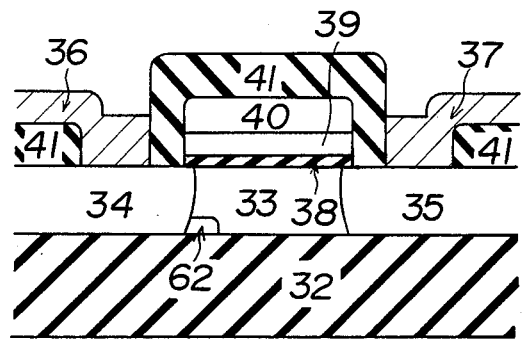

FIG. 11 shows an embodiment in which a leakage current flowing through an interface (hereinafter referred to as a "back surface") between a silicon layer 33 and an insulating layer is structurally prevented.

The arrangement of FIG. 11 is substantially the same as that of FIG. 5 except that a p+ region 62 is disposed in direct contact with the insulating layer 32 and the n+ source region 34. With such a high concentration region provided in a portion of the back surface, any leakage current can be reduced to a considerably low level. The p+ region 62 is arranged in direct contact with the n+ source region, and has a concentration selected to be nearly $1 \times 10^{19}$ cm$^{-3}$ or higher so that any potential difference between both of the regions will be eliminated by a tunnel current. Therefore, when the p+ region is negatively biased due to a lack of holes flowing therefrom, such a negative voltage is immediately eliminated by the tunnel current. As the p+ region 62 is substantially kept at the same potential as that of the source region, the effective area in which electrons are injected from the source region to the channel is effectively reduced. The structure shown in FIG. 11 is effective both to the case shown in FIG. 5 and to the case where the channel region 33 is high resistivity region.

Figure 12:
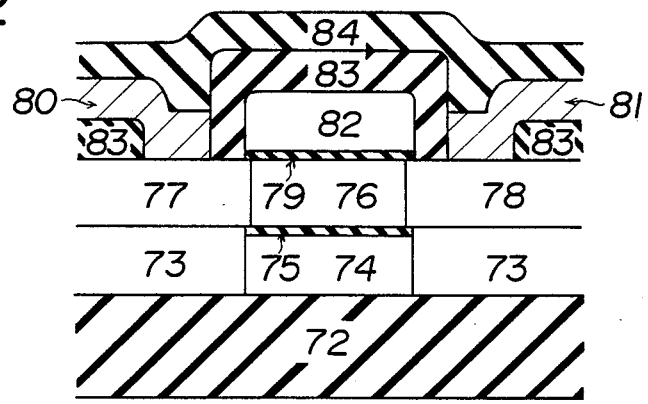
Figure 13:
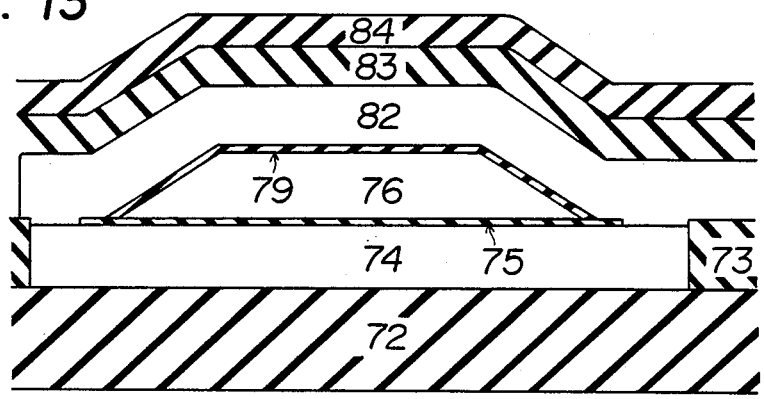

FIGS. 12 and 13 illustrate an embodiment in which a leakage current through which carrier flow is increased. FIG. 12 is a cross-sectional view taken along a source-to-drain direction, and FIG. 13 is a cross-sectional view taken across a channel region. The regions of an n channel MOS transistor will be described. Designated at 71 is a silicon substrate, 72 an insulating layer, 73 an insulating layer, 74 a gate electrode (II), 75 a gate insulating film (II), 76 a high-resistance channel region, 77 a n+ source region, 78 an n+ drain region, 79 a gate insulating film (I), 80 a source electrode, 81 a drain electrode, 82 a gate electrode (I), 83 a PSG film, and 84 a PSG film or a film of Si$_3$N$_4$. The transistor is constructed such that the gate electrodes (I), (II) are disposed upwardly and downwardly of the high resistivity channel region. The lower and upper gate electrodes 74, 82 are connected as shown in FIG. 13. Although in FIG. 13 the upper and lower gate electrodes are connected on both sides of the channel, they are not required to be interconnected on both sides of the channel. The electrodes may be connected only on the right-hand side in which a gate voltage is applied. The gate electrode 74 is formed of, for example, p+ polysilicon, or a baron-doped silicon-rich molybdeunum silicide, a tungste silicide, tantal silicide, or titunum silicide. The silicon-rich silicide may be employed as it can be oxidized in substantially the same manner as silicon. The gate electrode 82 is formed of p+ polysilicon or p+ polysilicon and a layer of silicide such for example as MoSi$_2$, WSi$_2$, TiSi$_2$, TaSi$_2$, Pd$_2$Si or metal of a high melting point such for example as Mo, W, Ti, Ta. The silicide or metal layer being superposed on the p+ polysilicon. The gate electrode 82 may also be formed of silicide such for example as MoSi$_2$, WSi$_2$, TiSi$_2$, TaSi$_2$, Pd$_2$Si or of high melting point metal such for example as Mo, W, Ta, Ti. The insulating layers 72, 73 may be formed of the same insulating material or different insulating materials. In case of an area in which the gate electrode 74 will be formed is to be defined by etching, the insulating layers 72, 73 should preferably be of different materials such as SiO$_2$ and Si$_3$N$_4$ since only the insulating layer 73 is etched by selective etching and such etching can be stopped just at the surface of the insulating layer 73. For example, according to reactive ion etching using a gas of Ch$_2$F$_2$ or CH$_3$F, the selective ratio of etching rates for Si$_3$N$_4$ and Si$_2$O is 20 or higher, and the etching rate selectivity is quite good. An embodiment having a tapered shape edge of the channel region is illustrated in FIG. 13. A channel region edge can be replaced by other shapes such as a vertical structure. The gate insulating films 75, 79 are composed of a film of such for example as SiO$_2$, Si$_3$N$_4$, SiO$_x$N$_y$ or composed of complex films of SiO$_2$ and Ta$_2$O$_3$.

Figure 14:
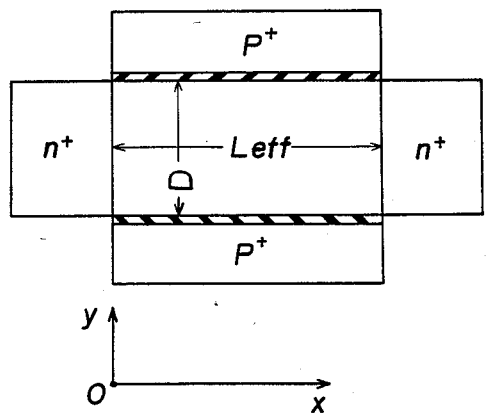
FIG. 14 is a diagram of a model used for designing a MOS transistor according to the present invention.

Design theory of the transistor will now be described. A MOS transistor of the present invention having a high resistivity region as a channel is schematically shown as a two-dimensional model in FIG. 14 on the condition that the width of a gate is greater than the depth of the channel. The distance between a source and a drain is indicated by $L_{eff}$ and the depth of the channel region by D. The left hand n+ region serves as a source region, and the right hand n+ region serves as a drain region. There are p+ gates located upwardly and downwardly of the channel with thin insulating films interposed therebetween. Assuming that the left hand lower corner of the channel region is used as a coordinate origin and the gate insulating films are sufficiently thin, boundary conditions for determining a potential distribution in the channel are given, under the condition that the gate and the source are at the same potential, as follows:

$$\phi(O,y)=0$$

$$\phi(x,O)=-V_{bi}$$

$$\phi(x,D)=-V_{bi}$$

$$\phi(L_{eff},y)=V_d$$

where $\phi$ is the potential, $V_d$ is the drain voltage, and $V_{bi}$ is the source-to-gate diffusion potential and is expressed by:

$$V_{bi} = \frac{KT}{q} \ln \frac{N_s N_G}{n_i^2} \quad (14)$$

For the sake of brevity, the source and the drain have concentrations that are assumed to be equal to each other. If there is any difference between the concentrations of the source and drain regions, then $$\phi(L_{eff}, y) = V_d - \frac{KT}{q} \ln \frac{N_S}{N_D} \quad (15)$$

should be used as a boundary condition, where $N_S$, $N_G$, and $N_D$ are the impurity concentrations of the source, gate, and drain regions. For the sake of brevity, furthermore, the upper and lower p+ regions are of impurity concentrations that are assumed to be equal to each other. Under the boundary condition (13), the Laplace's equation $$\nabla^2\phi=0 \quad (16)$$

is solved and the solution is given by:

$$\phi(x_n, y_n) = (4F_d/\pi) \times \Sigma [\sinh ((2n + 1)\pi L_n x_n) \times \quad (17)$$
$$\sin ((2n + 1)\pi y_n)/(2n + 1)\sinh ((2n + 1)\pi L_n)] -$$
$$(4V_{bi}/\pi) \times \Sigma[\sinh ((2n + 1) \pi(1 - y_n)/L_n) \times$$
$$\sin ((2n + 1)\pi x_n)/(2n + 1)\sinh ((2n + 1)\pi/L_n)] -$$
$$(4V_{bi}/\pi)) \times \Sigma[\sinh ((2n + 1)\pi y_n/L_n) \times$$
$$\sin ((2n + 1)\pi x_n)/(2n + 1)\sinh ((2n + 1)\pi/L_n)]$$

where $L_n = L_{eff}/D$, $x_n = x/L_{eff}$, $y_n = y/D$.

Figure 15:
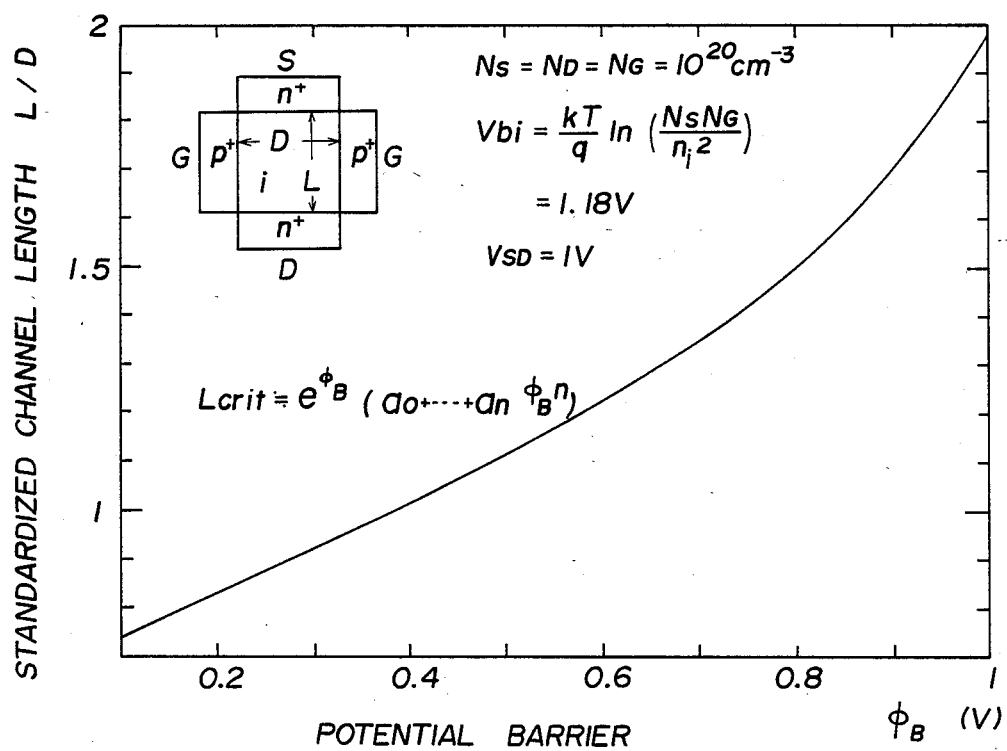
FIGS. 15 and 16 are graphs showing the relationship between a potential barrier and a normalized channel length.
Figure 16:
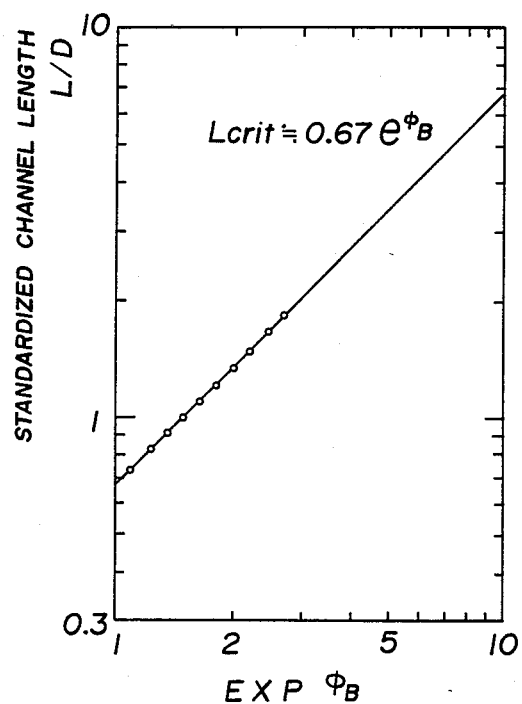

A potential barrier height $\phi_B$ created in the channel at zero gate bias voltage will now be determined under the condition that $N_S = N_G = N_D = 1 \times 10^{20}$ cm$^{-3}$ ($V_{bi} = 1.18$ V: room temperature), and $V_d = 1.0$V. FIG. 15 shows a relationship of the values of $\phi_B$ to $L_n$ plotted on linear scale, and FIG. 16 shows it plotted on a logarithmic scale. The following approximate formula is obtained:

$$L_{crit} \approx 0.67 \, exo\phi_B \quad (18)$$

To obtain $\phi_B = 0.6$V which can ensure a sufficient holding time when the transistor is used in a dynamic memory, $$L_{crit} \approx 1.22 \quad (19)$$

Therefore, the effective channel length $L_{eff}$ required is 1.22 times larger than the channel depth D.

It is natural that the effective channel length for achieving a desired potential barrier $\phi_B$ under the off state should be longer as $V_d$ is greater, $V_{bi}$ is smaller, and the insulating film is thicker, as can be derived from the equation (17). Since a relation between the potential barrier height and the effective channel length under the off state at a condition of $V_d = 1$V are found in FIGS. 15 and 16, $L_{eff}$ is about 1.2D if $\phi_B$ is 0.6V under the off state. If D is 0.55 μm, 0.1 μm, 0.2 μm, and 0.3 μm, then $L_{eff}$ is 0.66 μm, 0.12 μm, 0.24 μm, and 0.36 μm, respectively. Therefore, the channel can be shortened to very short lengths.

Figure 2:
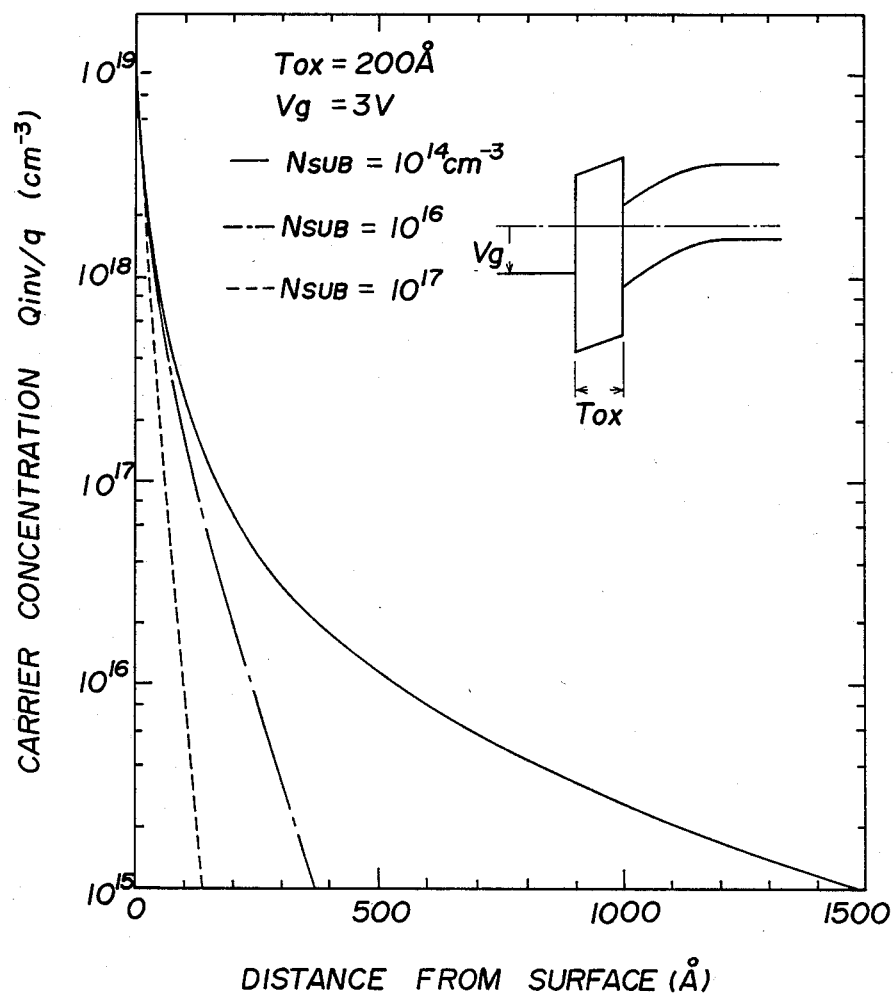
FIG. 2 is a graph showing a distribution of carrier concentrations below a gate insulating film.

As described in detail in Japanese Patent Application No. 57-113709 "Semiconductor Integrated Circuit" and J. Nishizawa, T. Ohmi, and H. L. Chen, "A Limitation of Channel Length in Dynamic Memories", IEEE Trans. electron Devices, Vol. ED-27, pages 1640-1649, (August 1980), the drain voltage gives an influence deeply into the channel region in one of the MOS transistor according to the embodiment of the present invention with a high resistivity channel region, unlike conventional MOSFETs. For this reason, the MOS transistor of the present invention has two prominent features which the conventional MOSFETs have failed to provide. One feature is that since the drain voltage has its effect in a wide range in the channel region, the electric field intensity produced in the channel by the same drain voltage is sufficiently lower than that in the conventional MOSFETs. As a result the drain breakdown voltage is higher. The hot-electron effect is lowered to reduce the problem of a threshold voltage shift due to injection of hot electrons into the gate insulating layer. Another feature is that since the drain voltage is effective deeply inside the channel region, carriers injected from the source do not flow only through a narrow path (FIG. 2) just under the gate insulating film, but flows widely in the channel region. This results in an advantage in that as the part of carriers flow as bulk conduction without suffering surface scattering, the velocity of carriers is increased to increase the value of a current, and transconductance. The effect of a space charge of carriers injected from the source into the channel region is not completely cancelled by the gate electrode, but acts on the drain electrode. Electric source lines from a part of space charges in the channel region terminate in the electrode, and the remaining part terminates in the drain region. Thus, a space charge resistance of part of the carriers injected from the source into the channel region enters between the source and the drain. Since the space charge resistance is however proportional substantially to the square of the channel length, there is no large effect in a short channel devices having a channel length ranging from 0.05 μm to 0.5 μm. The current flow becomes greater as the channel length is smaller.

The first prerequisite for making high speed semiconductor integrated circuits depends on how to increase the effective current density in the transistor. The current density J is provided by the next equation when ignoring the diffusion:

$$J = q\,n\,v \quad (20)$$

where, n, q and v is respectively, electron-density, unit electronic charge and drift velocity of electron. Increasing the product nv may increase the current density. This means to increase the velocity v or the electron density n. In the conventional devices of which dimensions are rather large, since the effect of the space charge resistance and space charge voltage are large, it is the only way to make the electron density n as low as possible, and to make the electron velocity v as large as possible in order to get the large current-density with small voltages.

In the case of that the electrons distributing uniformly travel at a saturation velocity $v_s$, space charge resistance $R_{sc}$ is given by $$R_{sc} = \frac{L_{eff}^2}{2\epsilon_s S v_s} \quad (21)$$

The space charge voltage $V_{sc}$ by space charge distributing uniformly is expressed by:

$$V_{sc} = \frac{q\,n\,L_{eff}^2}{2\epsilon_s} \quad (22)$$

where, S=area, $L_{eff}$=effective channel length, $\epsilon_s$=dielectric constant of semiconductor.

Provided that the distribution is uniform, both $R_{sc}$ and $V_{sc}$ are proportional to $L^2_{eff}$, and become small rapidly as the device geometry becomes finer.

Table 2 shows the definite values of the dependency of the space charge resistance $R_{sc}$ per unit area on the device dimension $L_{eff}$, and the values of the voltage drop by $R_{sc}$ in the case that the current of three kinds of density flows.

TABLE 2

| dimension $L_{eff}$ | space charge resistance $R_{sc}$ Ω – cm² | voltage drop $R_{sc}J$ | | |
|---|---|---|---|---|
| | | 1 × 10⁴ A/cm² | 3 × 10⁴ A/cm² | 1 × 10⁵ A/cm² |
| 1 μm | 4.8 × 10⁻⁴ | 4.8 V | 14.4 V | 48 V |
| 0.3 μm | 4.3 × 10⁻⁵ | 0.43 V | 1.29 V | 4.3 V |
| 0.1 μm | 4.8 × 10⁻⁶ | 0.048 V | 0.144 V | 0.48 V |

The saturation velocity $v_s = 1 \times 10^7$ cm/sec is substituted into the equation (21). In the device of 1 μm dimension, it is impossible to flow $1 \times 10^4$ A/cm² current density at small voltages because the space charge resistance is large. When the device is made fine to 0.1 μm, $1 \times 10^5$ A/cm² current-density can be obtained with small voltages such as 0.48V. In the case of bipolar-transistors impurity concentration of the high resistivity region between base and collector is enlarged up to certain degree so that the space charge resistance has no effect up to high current density level However, that results in requiring certain voltages to deplete the region. Table 3 shows the relation between the current-density J and the electron concentration n, in the case that electrons travel at a saturation velocity given by $1 \times 10^7$ cm/sec, i.e., $J = q\,n\,v_s$. Table 3 also shows the voltage $V_{sc}$ required to deplete the impurity concentration region with an impurity concentration of $J/qv_s$. The value of $V_{sc}$ is given by the equation (22), where the electron density n is replaced by $J/qv_s$. It is obvious that the space charge effect is decreasing drastically as the dimension of the devices are decreasing such for example as 0.3 μm to 0.1 μm.

That is, in the field of the devices having ultimately small geometry, it is possible to enlarge the electron density enough without deteriorating the performance for the purpose of realizing large current density, except the way of making the operation speed high to restrain the density at a low level.

TABLE 3

| current density J(A/cm²) | electron density n(cm⁻³) | voltage $V_{sc}(V)$ | | |
|---|---|---|---|---|
| | | 1 μm | 0.3 μm | 0.1 μm |
| 3 × 10³ | 1.88 × 10¹⁵ | 1.43 | 0.129 | 0.0143 |
| 1 × 10⁴ | 6.25 × 10¹⁵ | 4.76 | 0.429 | 0.0476 |
| 3 × 10⁴ | 1.88 × 10¹⁶ | 14.3 | 1.29 | 0.143 |
| 3 × 10⁵ | 6.25 × 10¹⁶ | 47.6 | 4.29 | 0.476 |

A limitation on efforts to reduce the size of devices will briefly be described. Details are described in Tadahiro Ohmi, "Ultra-high-concentration semiconductor and ultra-high purity semiconductor Introductory Talk", Proc. No. 399-1, Applied Solid State Physics Division of the Japan Society of Applied Physics (July 19, 1983). For the device which can realize high-speed and low-energy-consumption VLSI, large current as possible can be flowed with small voltage as possible. For higher device performance, a source region should preferably have a higher carrier concentration since no large current will flow unless a large quantity of carriers are supplied from a source region. It is preferable that electrically active impurity atoms are doped at a concentration as high as possible in a source region. In case the carrier concentration in the source region was low, the device would operate in a mode of injected carrier limited current flow mechanism.

GaAs has a single condition band minimum having a small effective mass (a small state density) at a center part of the Brillouin zone so that an electron concentration in the n+ region is suppressed at a low level less than about $5 \times 10^{18}$ cm$^{-3}$ at a room-temperature even if a large amount of impurities are doped.

An existence of an electron concentration of $n_e$ fills the conduction band up to an energy level of $\epsilon_{max}$ from a bottom of the conduction band, such as $$\epsilon_{max} = \frac{h}{2m_e} (3\pi^2 n_e)^{2/3} \quad (23)$$

where $m_e$ and h ($=2\pi\hbar$) are an effective mass of electrons and Planck's constant, respectively. The value of $\epsilon_{max}/q$ in GaAs are 54 mV and 250 mV for $n_e = 1 \times 10^{18}$ cm$^{-3}$ and $1 \times 10^{19}$ cm$^{-3}$, respectively. An increase of $\epsilon_{max}$ compared to a thermal energy of an ambient temperature makes it difficult to excite electrons from impurity levels the conduction band. Thus, the maximum electron concentration must be limited about $5 \times 10^{18}$ cm$^{-3}$ at a room temperature in GaAs even if there exist impurities having a concentration much more than that.

An average minimum distance between adjacent electrically active impurity atoms is about 60 Å in GaAs. Since in Si there exists 6 valleys with relatively large effective mass (a high state density) of electrons in the Brillouin zone, together with the effect of band gap narrowing achieved at the time of a high concentration, there can be realized an n+ region having an electron concentration of about $5 \times 10^{20}$ cm$^{-3}$. An average minimum distance between adjacent electrically active impurity atoms becomes about 12.6 Å in Si. The flatness of the interface at an n+ i junction (i means a high resistivity region), an n+n on n+p junction is much better with Si than with GaAs. Because an n+ region must include at least a few impurity atoms when viewed in a one-dimensional direction, a geometry of the n+ region can be reduced much more easily with Si than with GaAs, there being at least five fold difference in between as to the ease of size reduction between Si and GaAs. The limitation on the reduction of the channel length is determined by the size of a wave packet which describes electrons. The semiconductor device operates only in a range in which a particle picture is established such that electrons are injected from the source region and travel to the drain. The channel length required should be at least several times larger than the wave packet in order to keep the particle picture in the channel region. The minimum value $\Delta x_{min}$ of the size of a wave packet is given by:

$$\Delta x_{min} = \frac{h}{2(m_e KT)^{1/2}} \quad (24)$$

where T is the temperature, and $m_e$ is the effective mass of an electron. The value $\Delta x_{min}$ becomes larger as the mass $m_e$ is greater. The values $\Delta x_{min}$ of GaAs and Si at room temperature are 35 Å and 15 Å, respectively. Therefore, the device of shorter channel length structure can be made with Si than with GaAs.

Figure 17A:
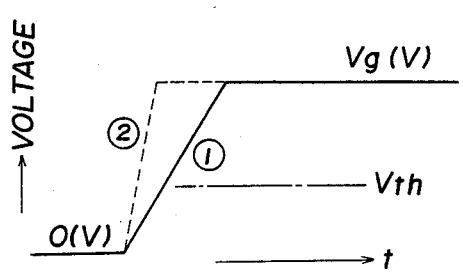
FIGS. 17(a) and 17(b) are diagrams illustrating the operation of a floating channel MOS transistor of the present invention.
Figure 17B:
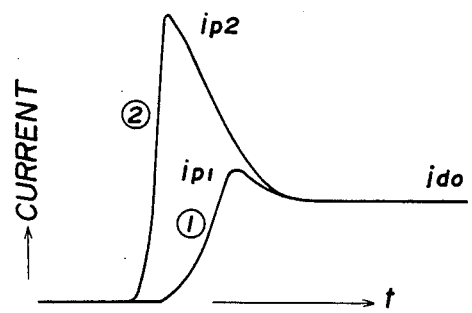

The MOS transistor illustrated in FIGS. 12 and 13 has quite a small input capacitance in off state even if the gate insulating film is of a greatly reduced thickness of 100 Å or less. Therefore, the MOS transistor of the present invention can be driven at a short rise time with a small current, and the channel region voltage becomes momentarily lower with respect to the source region as the applied gate voltage rises faster, to thereby allow a large quantity of electrons to be injected from the source region to the channel region and hence a large current to flow. Such a manner is illustrated in FIGS. 17(a) and 17(b). FIG. 17(a) shows the waveform of a voltage applied to the gate, and FIG. 17(b) the waveform of a drain current which flows at the time the drain voltage is kept at a constant $V_{do}$. Designated at $V_{th}$ is a threshold voltage, and $i_{do}$ is a current flowing stationarily through the MOS transistor of the invention when the gate voltage is $V_g$ and the drain voltage is $V_{do}$. When the gate voltage rises quickly as shown by the curves 1 and 2 in FIG. 17(a) instantaneous transient currents which flow until a stational current $i_{do}$ is reached are increased as indicated by the curves 1 and 2 in FIG. 17(b). FIG. 17(b) only shows conductive currents without capacitive currents. The faster the gate voltage rises, the greater the current which flows instantaneously. Thus, the driving capability is increased and a high-speed operation is rendered possible in VLSA. The MOS transistor according to this invention has the characteristic that the current flows the greater, as the operation speed is higher when the channel is in floating condition.

Figure 18:
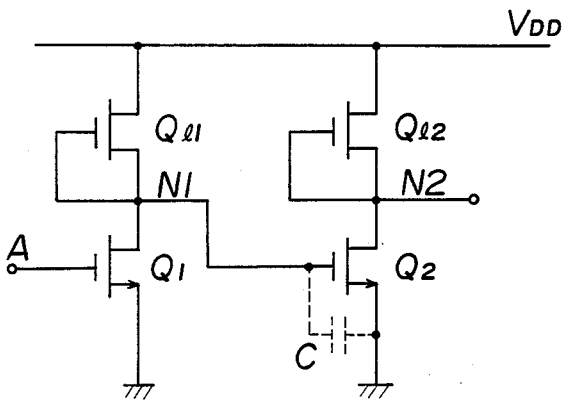
FIG. 18 is a circuit diagram of an inverter composed of MOS transistors according to the present invention.

An inverter circuit shown in FIG. 18 will be described for a more detailed description of the MOS transistor according to the present invention. Denoted at $Q_1$, $Q_2$ are MOS transistors of the invention and $Q_{11}$, $Q_{12}$ depletion-mode MOSFETs as loads. A capacitance C indicated by the dotted line is an input capacitance of the second inverter as seen from the first inverter (the input capacitance including a gate input capacitance, a wiring capacitance including a gate input capacitance, a wiring capacitance and the like). Also denoted at $V_{DD}$ is a power supply voltage. When an input A to the first inverter is of a low level $V_L$, $Q_1$ is in an off-state and the potential at a point N1 is of a high level $V_H$ ($=V_{DD}$). Therefore, the capacitor C is charged to $V_H$. When the input A is changed to a high level, $Q_1$ is turned on. If the input A varies from the low level to the high level at a high speed at this time, then an instantaneous high current flows through $Q_1$ as shown in FIG. 17(b), and hence a charge ($=CV_H$) charged in the capacitor C is discharged quite rapidly through $Q_1$, so that the gate of $Q_2$ varies quite rapidly from the high level to the low level and $Q_2$ changes from the ON state to the OFF state at a high speed. The MOS transistor of the invention in which a large transient current as shown in FIG. 17(b) can be passed is greatly suitable for high-speed operation. The E/D inverter shown in FIG. 18 is designed such that the resistance $R_L$ of the load transistor $Q_{11}$, $Q_{12}$ is of a value larger than the on-resistance of the driver transistor by a magnitude of about one order. Therefore, when the input A varies from the high level to the low level, $Q_1$ is immediately turned off. However, since the input capacitor C of the next inverter is charged from the low level to the high level through the load transistor $Q_{11}$, its time constant becomes $R_L C$, and the operation speed is determined by a time constant which is determined by the resistance and the input capacitance of the load transistor.

Figure 19:
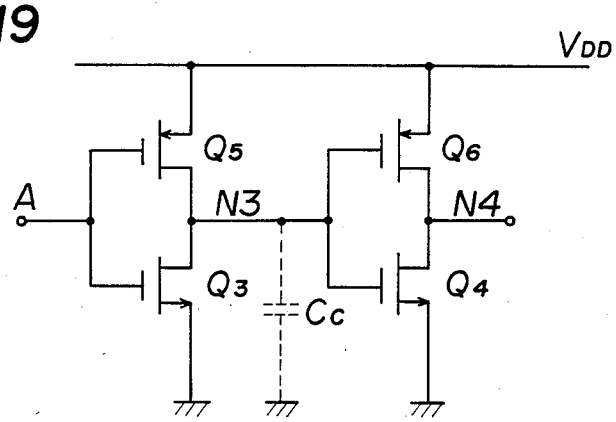
FIG. 19 is a circuit diagram of a CMOS inverter composed of MOS transistors according to the present invention.

A CMOS construction is advantageous for a large instantaneous current characteristic of the MOS transistor of the invention to be effective in the process of from the OFF to ON state or vice versa. FIG. 19 illustrates such a CMOS construction. Designated at $Q_3$, $Q_4$ are n channel MOS transistors according to the present invention, $Q_5$, $Q_6$ p channel MOS transistors of the present invention, and $C_c$ a gate input capacitor including wiring capacitor of the second CMOS inverter circuit. When an input A is at a low level $V_L(=0)$, $Q_3$, $Q_6$, are turned off and $Q_4$, $Q_5$ are turned on. A point N3 is at a high level $V_H(=V_{DD})$ and a point N4 is at a low level $V_L(=0)$. The capacitor $C_c$ is charged to the high level (the stored charge at the time: $C_cV_H$) When the input A is changed from the low level to the high level, $Q_5$ is turned off and $Q_3$ is turned on. If the voltage of the input A changes rapidly, a large instantaneous current flows through $Q_3$, so that the charge $C_cV_H$ stored in the next gate input capacitor $C_c$ is discharged rapidly through $Q_3$, and the next gate voltage is immediately brought to the low level. Therefore, $Q_4$ is turned off and $Q_6$ is turned on quickly. Then, when the input A varies from the high level to the low level, $Q_3$ is immediately turned off and $Q_5$ is turned on. Since a large instantaneous current flows through $Q_5$, the next gate input capacitor $C_c$ is immediately charged from the low level to the high level. The CMOS inverter constructed of SOIMOS transistors having channel regions in floating condition, that is, the MOS transistors of the present invention, can be switched at a high speed from the OFF to ON state or vice versa with the large instantaneous current acting effectively. Since the large instantaneous current becomes greater as the switching speed is higher, the effect of the instantaneous current becomes greater as the speed of operation goes higher.

Figure 20:
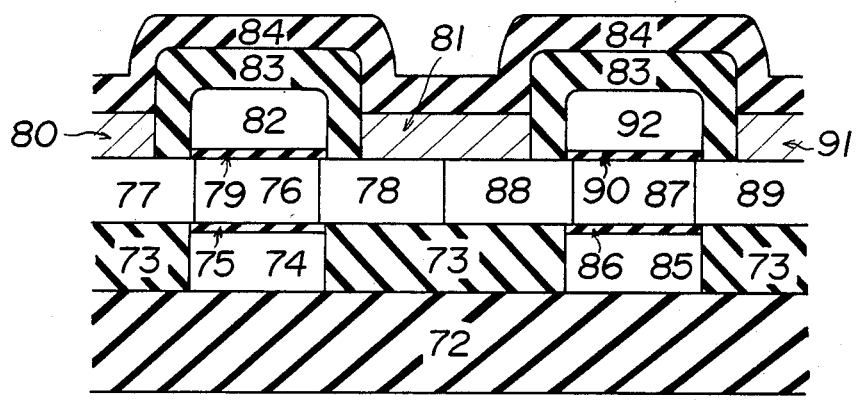
FIG. 20 is a cross-sectional view of a CMOS employing a MOS transistor according to the present invention.

FIG. 20 shows a cross section of a CMOS construction employing MOS transistors of the present invention. The reference numerals up to 84 in FIG. 20 denote identical parts shown in FIGS. 12 and 13. The reference numerals 85 to 93 designate regions of a p channel MOS transistor according to the present invention. Denoted at 85 is a gate electrode (III), 86 a gate insulating film (III), 87 a high resistivity channel region, 88 a p+ drain region, 89 a p+ source region, 90 a gate insulating film (IV), 91 a source electrode of a p channel MOS transistor, and 92 a gate electrode (IV). The gate electrodes (III) and (IV) are in the form of a multi layer construction of n+ polysilicon, n+ polysilicon and silicide such for example as $MoSi_2$, $WSi_2$, $TaSi_2$, $TiSi_2$ or the like, or metal of a high melting point such for example as Mo, W, Ta, Ti. The gate electrodes (III) and (IV) may be of silicide and metal of a high melting point. At any rate, the gate electrodes (III) and (IV) should be of material having a high diffusion potential with respect to the p+ region and capable of producing a desired potential barrier in the high resistivity channel region in the OFF state. The electrode 81 is held in contact with the drain regions of the n channel and p channel transistors.

In the transistor having gate electrodes above and below the high resistivity channel region as shown in FIGS. 12 and 13 or 20, the insulating layer 72 is of a relatively increased thickness ranging from 0.5 to 2 $\mu$m, for example to reduce the gate input capacitance as small as possible. The gate insulating films 75, 79, 86, 90 have a thickness ranging from 50 Å to 500 Å dependent o the channel length and the channel region thickness. If $L_{eff}$ and D are small, then the thickness of the gate insulating film is naturally reduced. The MOS transistor of the present invention is called "Floating Channel MOS Transistor" or "High Transient Current MOS Transistor".

Figure 21A:
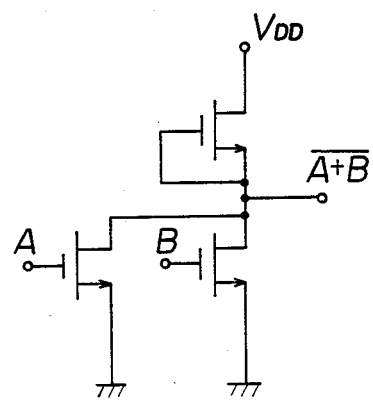
FIGS. 21(a) and 21(b) are circuit diagrams of logic circuits of the E/D arrangement using MOS transistors of the present invention.
Figure 21B:
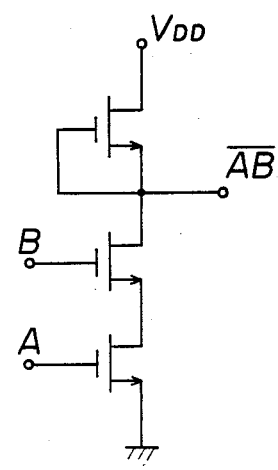
Figure 22A:
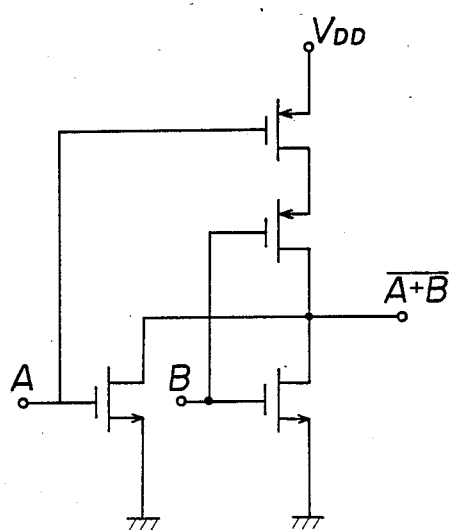
FIGS. 22(a) and 22(b) are circuit diagrams of CMOS logic circuits using MOS transistors of the present invention.
Figure 22B:
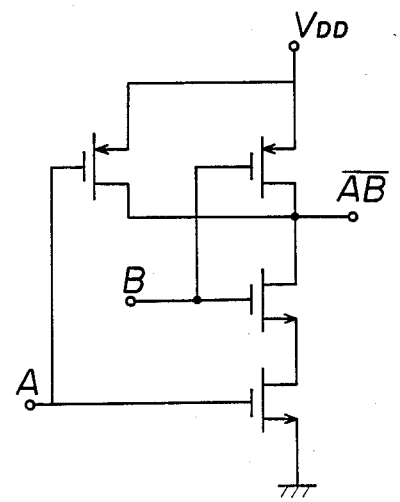

The MOS transistor of the present invention can be employed to construct various logic circuits and various memory circuits. FIGS. 21(a) and 21(b) show NOR and NAND circuits of an E/D 2-input construction. FIGS. 22(a) and 22(b) illustrate NOR and NAND circuits of a CMOS 2-input construction. Other semiconductor circuits such as flip-flops, dynamic RAMs, and static RAMs, for example, can be constructed of MOS transistors of the present invention.

Figure 23A:
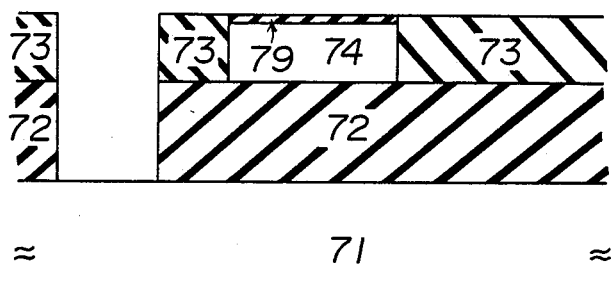
FIGS. 23(a) through 23(c) are views showing progressive steps of fabricating a transistor according to the present invention.
Figure 23B:
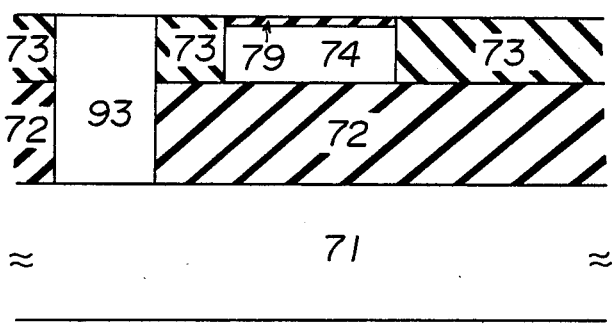
Figure 23C:
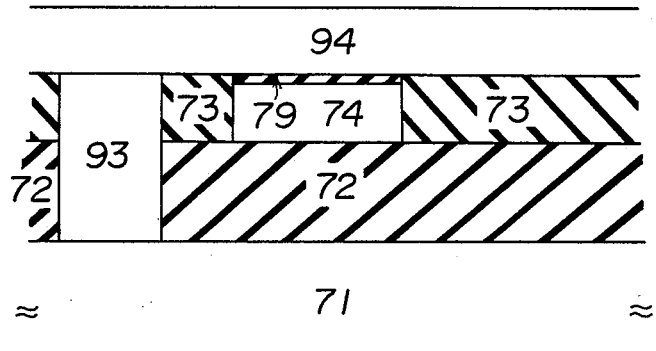

A MOS transistor having a floating channel on an insulating layer on a silicon substrate can be fabricated by depositing polysilicon on an insulating layer of $SiO_2$, for example, by CVD using a gas such as $SiH_4$ or $Si_2H_6$, for example, and forming a single-crystal transistor or a polycrystalline transistor with quite a large crystal grain (which should be sufficiently large as compared with a single transistor) by laser annealing or electron beam annealing. Instead of using the laser annealing or the like, polysilicon on $SiO_2$ may be covered with an insulating film of $Si_3N_4$ or $SiO_2$ for example, and the polysilicon or amorphous silicon may be formed into a single crystal by heat annealing with a carbon heater. By previously making polysilicon or amorphous silicon single crystal at a position where to start annealing, the formation of a single crystal by annealing can be accelerated, a process known as bridging epitaxy. When bridging epitaxy is employed, the thin layer of silicon on $SiO_2$ should preferably be amorphous rather than polycrystalline. A good single crystal can be formed by solid phase epitaxy of heat annealing at a temperature of about 600° C. A process of depositing the thin amorphous silicon layer by low-temperature CVD (at a temperature ranging from 500° to 550° C., for example) and producing a single-crystal layer is particularly suitable for fabricating the construction as shown in FIGS. 12 or 20 in which the gates are disposed above and below the channel. One example is such a process as shown in FIGS. 23(a) through 23(c). A substrate 71 comprises an n+ substrate. After up to an insulating layer 72, 73 in which a gate electrode 74 is buried has been fabricated, the insulating layer 72 and 73 on the left hand side of the gate electrode 74 is etched to a prescribed size by reactive ion etching as shown in FIG. 23(a). After the surface has been cleaned, a thin layer of amorphous silicon is deposited by CVD. The amorphous silicon deposited on side walls of the etched insulating layer is crystallized by solid-phase epitaxy with annealing at about 600° C. Thereafter, single-crystal silicon 93 is formed only in the the etched hole by reduced-pressure selective epitaxial growth at a temperature ranging from about 800° to 900° C. using a gas of $H_2+SiH_2Cl_2+HCL$, as shown in FIG. 23(b). At the time single-crystal region 93 grows, a dopant gas of $AsH_3$ or $PH_3$ is simultaneously supplied to dope the region 93 into an n+ region An amorphous silicon layer 94 is deposited to a given thickness by low-temperature CVD using a gas of $SiH_4$, $Si_2H_6$ or the like. Subsequently, the amorphous layer 94 is turned into a single crystal by annealing at about 600° C. with the single-crystal region 93 using as a speed. Then, a MOS transistor of the invention is formed in the single-crystal Si layer as illustrated in FIG. 12. By positioning the n+ source region 77 on the n+ region 93, the potential of the n+ source region can be given from the n+ substrate 71, so that the electrode 80 for wiring the source can be dispensed with. This is highly advantageous since the wiring arrangement is quite simple in laying out a complex random logic.

The insulating layer may be formed of not only $SiO_2$ or $Si_3N_4$, but also magnesia spinel or $CaF_2$ or the like which can be formed by epitaxial growth.

The MOS transistor of the present invention is not limited to the illustrated embodiments. It may be of the opposite conductivity type. The semiconductor may be of a material other than Si. The principal requirement is that the channel, other than portions adjacent to the source and drain regions, should be substantially covered by the insulating layer so that the channel region is substantially under floating condition. The substrate may be replaced by insulating substrates such as sapphire spinel or insulator such for example as quartz. When the channel region is formed as a high resistivity region, the gate input capacitance is quite small and the gate voltage can be controlled at a high speed with a small current, and a large instantaneous current flows when the transistor changes rapidly from the OFF to ON state. Therefore, the transistor is particularly suitable for high-speed operation. Since the large instantaneous current is increased as the operation speed is higher, the high-speed operation capability of the transistor manifests itself in the high-speed operation mode of VLSI. Where a CMOS construction is composed of MOS transistors of the present invention, the large instantaneous current is highly effective in the switching process from the OFF to ON state or vice versa, reducing power consumption and achieving high-speed operation. The MOS transistor of the invention is of high advantage in the field of future VLSI.

Although certain preferred embodiments have been shown and described, it should be understood that many changes and modifications may be made therein without departing from the scope of the appended claims.

What is claimed is:

1. A semiconductor integrated circuit comprising an insulated-gate transistor serving as a driving transistor and composed of source and drain regions of one conductivity type and a high impurity concentration, a channel region disposed between said source and drain regions, an insulating layer covering the entire surface of said channel region except for portions adjacent to said source and drain regions, said insulating layer having at least a thinner portion, and a gate electrode of a conductive material disposed adjacent the thinner portion of said insulating layer for maintaining said channel region substantially in floating condition, the impurity concentration N of the channel region having a relation of $N<D^{-3}$ with respect to the depth D of the channel.

2. A semiconductor integrated circuit of claim 1 wherein said channel region has an opposite conductivity type to that of said source region.

3. A semiconductor integrated circuit of claim 1 wherein said channel region is formed of a high resistivity region.

4. A semiconductor integrated circuit of claim 3 wherein an insulating layer is provided for covering the entire surface of the channel region except for the portion adjacent to the source and drain region and wherein said insulating layer covers the gate electrode side face and the channel surface opposed to the gate electrode.

5. A semiconductor integrated circuit of claim 3 including an insulating layer for covering the entire surface of the channel region except for the portions adjacent to the source and drain regions and wherein said insulating layer covers the periphery of the channel region continuously to the insulating layer of the gate electrode side.

6. A semiconductor integrated circuit of claim 1 wherein the gate electrode adjacent the insulating layer covering the channel is formed of an opposite conductivity type than the source region.

7. A semiconductor integrated circuit of claim 1 wherein the gate insulating layer is formed of two layers of a $SiO_2$ film layer and a $Ta_2O_5$ film layer.

8. A semiconductor integrated circuit comprising an insulated-gate transistor serving as a driving transistor and composed of source and drain regions of one conductivity type and a high impurity concentration, a channel region disposed between said source and drain regions, an insulating layer covering the almost entire surface of said channel region except for portions adjacent to said source and drain regions, said insulating layer having at least a thinner portion, and a gate electrode of a conductive material disposed adjacent the thinner portion of said insulating layer for maintaining said channel region substantially in floating condition, the impurity concentration N of the channel region having a relation of $N<D^{-3}$ with respect to the depth D of the channel.

9. A semiconductor integrated circuit of claim 8 wherein said channel region has an opposite conductivity type to that of said source region.

10. A semiconductor integrated circuit of claim 9 wherein a very high impurity concentration region of the same conductivity type as said channel region is disposed on a part of the junction surface of said source region and said channel region adjacent the back surface thereof.

11. A semiconductor integrated circuit of claim 8 wherein said channel region is formed of a high resistivity region.

12. A semiconductor integrated circuit of claim 11 wherein a very high impurity concentration region of an opposite conductivity type to that of said source region is disposed on a part of the junction surface of said source region and said channel region adjacent the back surface thereof.

13. A semiconductor integrated circuit of claim 11 wherein an insulating layer is provided for covering the almost entire surface of the channel region except for the portion adjacent to the source and drain regions and wherein said insulating layer covers the gate electrode side face and the channel surface opposed to the gate electrode.

14. A semiconductor integrated circuit of claim 11 including an insulating layer for covering the almost entire surface of the channel regions except for the portion adjacent to the source and drain region and wherein said insulating layer covers the periphery of the channel region continuously to the insulating layer of the gate electrode side.

15. A semiconductor integrated circuit of claim 8 wherein the gate electrode adjacent the insulating layer covering the channel is formed of an opposite conductivity type than the source region.

16. A semiconductor integrated circuit of claim 8 wherein the gate insulating layer is formed of two layers of a $SiO_2$ film layer and a $Ta_2O_5$ film layer.

17. A semiconductor integrated circuit comprising two complementary insulated-gate transistors of different conductivity types having drain electrodes directly connected to each other and gate electrodes directly connected to each other, the connected gate electrodes serving as an input terminal and the connected drain electrodes serving as an output terminal, each of said insulated-gate transistors being composed of source and drain regions of one conductivity type and a high impurity concentration, a channel region disposed between said source and drain regions, an insulating layer covering the entire surface of said channel region except for portions adjacent to said source and drain regions, the insulating layer which covers said channel region having at least a thinner portion, and a gate electrode of a conductive material disposed adjacent to the thinner portion of said insulating layer for maintaining said channel region substantially in floating condition, the impurity concentration N of the channel region having a relation of $N<D^{-3}$ with respect to the depth D of the channel.

18. A semiconductor integrated circuit of claim 17 wherein said channel region has an opposite conductivity type to that of said source region.

19. A semiconductor integrated circuit of claim 17 wherein said channel region is formed of a high resistivity region.

20. A semiconductor integrated circuit of claim 19 wherein an insulating layer is provided for covering the entire surface of the channel region except for the portions adjacent to the source and drain regions and wherein said insulating layer covers the gate electrode side face and the channel surface opposed to the gate electrode.

21. A semiconductor integrated circuit of claim 19 including an insulating layer for covering the entire surface of the channel region except for the portions adjacent to the source and drain regions and wherein said insulating layer covers the periphery of the channel region continuously to the insulating layer of the gate electrode side.

22. A semiconductor integrated circuit of claim 17 wherein the gate electrode adjacent the insulating layer covering the channel is formed of an opposite conductivity type than the source region.

23. A semiconductor integrated circuit of claim 17 wherein the gate insulating layer is formed of two layers of a $SiO_2$ film layer and a $Ta_2O_5$ film layer.

24. A semiconductor integrated circuit comprising two complementary insulated-gate transistors of different conductivity types having drain electrodes directly connected to each other and gate electrodes directly connected to each other, the connected gate electrodes serving as an input terminal and the connected drain electrodes serving as an output terminal, each of said insulated-gate transistors being composed of source and drain regions of one conductivity type and a high impurity concentration, a channel region disposed between said source and drain regions, an insulating layer covering the almost entire surface of said channel region except for portions adjacent to said source and drain regions, the insulating layer which covers said channel region having at least a thinner portion, and a gate electrode of a conductive material disposed adjacent to the thinner portion of said insulating layer for maintaining said channel region substantially in floating condition, the impurity concentration N of the channel region having a relation of $N<D^{-3}$ with respect to the depth D of the channel.

25. A semiconductor integrated circuit of claim 24 wherein said channel region has an opposite conductivity type to that of said source region.

26. A semiconductor integrated circuit of claim 25 wherein a very high impurity concentration region of the same conductivity type as said channel region is disposed on a part of the junction surface of said source region and said channel region adjacent the back surface thereof.

27. A semiconductor integrated circuit of claim 24 wherein said channel region is formed of a high resistivity region.

28. A semiconductor integrated circuit of claim 27 wherein a very high impurity concentration region of an opposite conductivity type to that of said source region is disposed on a part of the junction surface of said source region and said channel region adjacent the back surface thereof.

29. A semiconductor integrated circuit of claim 27 wherein an insulating layer is provided for covering the almost entire surface of the channel region except for the portions adjacent to the source and drain regions and wherein said insulating layer covers the gate electrode side face and the surface opposed to the gate electrode.

30. A semiconductor integrated circuit of claim 27 including an insulating layer for covering the almost entire surface of the channel region except for the portions adjacent to the source and drain regions and wherein said insulating layer covers the periphery of the channel region continuously to the insulating layer of the gate electrode side.

31. A semiconductor integrated circuit of claim 24 wherein the gate electrode adjacent the insulating layer covering the channel is formed of an opposite conductivity type than the source region.

32. A semiconductor integrated circuit of claim 24 wherein the gate insulating layer is formed of two layers of an $SiO_2$ film layer and a $Ta_2O_5$ film layer.

33. A semiconductor integrated circuit comprising an insulated-gate transistor serving as a driving transistor and composed of source and drain regions of one conductivity type and a high impurity concentration, a channel region disposed between said source and drain regions, an insulating layer covering the entire surface of said channel region except for portions adjacent to said source and drain regions, said insulating layer having at least two thinner portions, and at least two gate electrodes of a conductive material disposed adjacent these thinner portions of said insulating layer for maintaining said channel region substantially in floating condition.

34. A semiconductor integrated circuit of claim 33 wherein the impurity concentration N of the channel region has a relation of $N<D^{-3}$ with respect to the depth D of the channel.

35. A semiconductor integrated circuit comprising two complementary insulated-gate transistors of different conductivity types having drain electrodes directly connected to each other and gate electrodes directly connected to each other, the connected gate electrodes serving as an input terminal and the connected drain electrodes serving as an output terminal, each of said insulated-gate transistors being composed of source and drain regions of one conductivity type and a high impurity concentration, a channel region disposed between said source and drain regions, an insulating layer covering the entire surface of said channel region except for portions adjacent to said source and drain regions, the insulating layer which covers said channel region having at least two thinner portions, and at least two gate electrodes of a conductive material disposed adjacent to these thinner portions of said insulating layer for maintaining said channel region substantially in floating condition.

36. A semiconductor integrated circuit of claim 35 wherein the impurity concentration N of the channel region has a relation of $N<D^{-3}$ with respect to the depth D of the channel.

* * * * *